US008880772B2

(12) United States Patent
Sauber

(10) Patent No.: US 8,880,772 B2
(45) Date of Patent: Nov. 4, 2014

(54) SYSTEM AND METHOD FOR SERIAL INTERFACE TOPOLOGIES

(75) Inventor: William F. Sauber, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 908 days.

(21) Appl. No.: 12/474,988

(22) Filed: May 29, 2009

(65) Prior Publication Data

US 2010/0306440 A1 Dec. 2, 2010

(51) Int. Cl.
*G06F 12/06* (2006.01)
*G06F 13/16* (2006.01)

(52) U.S. Cl.
CPC ................... *G06F 13/1684* (2013.01)
USPC ................... 711/5; 711/105; 711/154

(58) Field of Classification Search
None
See application file for complete search history.

(56) References Cited

U.S. PATENT DOCUMENTS

| 5,652,856 | A | 7/1997 | Santeler et al. | |
|---|---|---|---|---|
| 6,970,968 | B1 | 11/2005 | Holman | |
| 7,124,270 | B2 * | 10/2006 | Dillon et al. | 711/167 |
| 2003/0061447 | A1 * | 3/2003 | Perego et al. | 711/131 |
| 2006/0041704 | A1 * | 2/2006 | Choi | 710/307 |
| 2008/0031030 | A1 * | 2/2008 | Rajan et al. | 365/63 |
| 2008/0052462 | A1 * | 2/2008 | Blakely et al. | 711/115 |
| 2008/0080261 | A1 * | 4/2008 | Shaeffer et al. | 365/189.05 |
| 2008/0082763 | A1 * | 4/2008 | Rajan et al. | 711/154 |
| 2008/0091888 | A1 * | 4/2008 | Sandy | 711/154 |
| 2008/0270717 | A1 * | 10/2008 | Shaw et al. | 711/162 |
| 2009/0307417 | A1 * | 12/2009 | Djordjevic | 711/105 |
| 2009/0327596 | A1 * | 12/2009 | Christenson et al. | 711/105 |

OTHER PUBLICATIONS

Haas et al., Fully-Buffered DIMM Technology Moves Enterprise Platforms to the Next Level, Technology @Intel Magazine, Mar. 2005, available at http://www.icc-usa.com/Fully-Buffered-DIMM-0305.pdf.

* cited by examiner

*Primary Examiner* — Kaushikkumar Patel
(74) *Attorney, Agent, or Firm* — Baker Botts L.L.P.

(57) ABSTRACT

A system and method for serial interface topologies is disclosed. A serial interface topology includes a replication device configured to receive control information from a controller interface. The replication device is configured to transmit two or more copies of substantially replicated control information to a device control interface. A data interface is configured to provide differential, point-to-point communication of data with the device controller interface.

4 Claims, 4 Drawing Sheets

SYSTEM AND METHOD FOR SERIAL INTERFACE TOPOLOGIES

TECHNICAL FIELD

The present disclosure relates generally to the operation of computer systems and information handling systems, and, more particularly, to a system and method for serial interface topologies.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system may include a serial interconnect to use differential, unidirectional, point-to-point signaling. With such signaling, a given signal line segment has only two transmit or receive connection points. A connection point at one end is provided with transmitter functionality, and a connection point at the other end is provided with receiver functionality. The data and address information for operations are typically embedded in packets. The unidirectional, differential, point-to-point interconnect approach is commonly used for variable packet length, single device to single device connections.

However, system memory topologies typically use single device to multiple devices connections—for example, a memory controller connected to multiple memory devices. To provide sufficient bandwidth, some memory topologies group multiple memory devices to respond to a single command and address to correspond to the bandwidth of the memory controller. Some memory devices such as dynamic random access memory (DRAM) interface to controllers using bus topologies and are optimized in such a way that implementing serial interfaces with the device can be difficult. For example, a native serial interface with multiple DRAMs would typically require a copy of the address information for each DRAM component. Memory controllers transmit data and address information for operations, but typically send one copy of the address information to multiple DRAM components. For a memory controller to operate in a fixed packet length serial point to point environment with multiple memory devices such as DRAM with native serial interfaces, the memory controller must send a copy of the address and control information for each DRAM component in order to maintain the point-to-point topology. This places a substantial burden on the memory controller.

To address such difficulties, approaches to serial interface topologies have been directed to multiplexing address information and write data on a single path. Other approaches have resorted to topologies that are not native serial interconnects, such as configurations that dispose all the memory devices in a parallel interface. However, multiplexing and using interconnects that are not point-to-point can require tradeoffs relating to one or more of speed, performance, efficiency, cost, complexity, device pin count, and scalability. Therefore, a need exists in the art for memory system architectures or memory topologies that address the difficulties of native point-to-point interfaces, while maintaining the unidirectional, differential and point-to-point topology.

SUMMARY

In accordance with the present disclosure, a system and method for serial interface memory topologies includes a replication device configured to receive address and control information from a controller interface. The replication device is configured to transmit two or more copies of substantially replicated address and control information to a memory device control interface. A memory data interface is configured to provide differential, point-to-point communication of data with the controller interface.

The system and method disclosed herein is technically advantageous because of the potential for unidirectional, differential, point-to-point interconnect topology to optimize speed. At very high speeds, the present invention is preferable to conventional two-way data buses, for example, which are more limited at very high speeds. Other technical advantages include cost effectiveness and reduced complexity of transmission and receiving devices, especially for systems operating at very high speeds. For example, the present invention eliminates the need for multiplexing and demultiplexing of data and address information, as well as related scheduling complexities, in serial interconnect topologies. Yet another technical advantage is upgradeability, scalability and reduced pin count with the use of fan-out aspects of the disclosed topologies. Other technical advantages will be apparent to those of ordinary skill in the art in view of the following specification, claims and drawings.

BRIEF DESCRIPTION OF THE DRAWING

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1A:
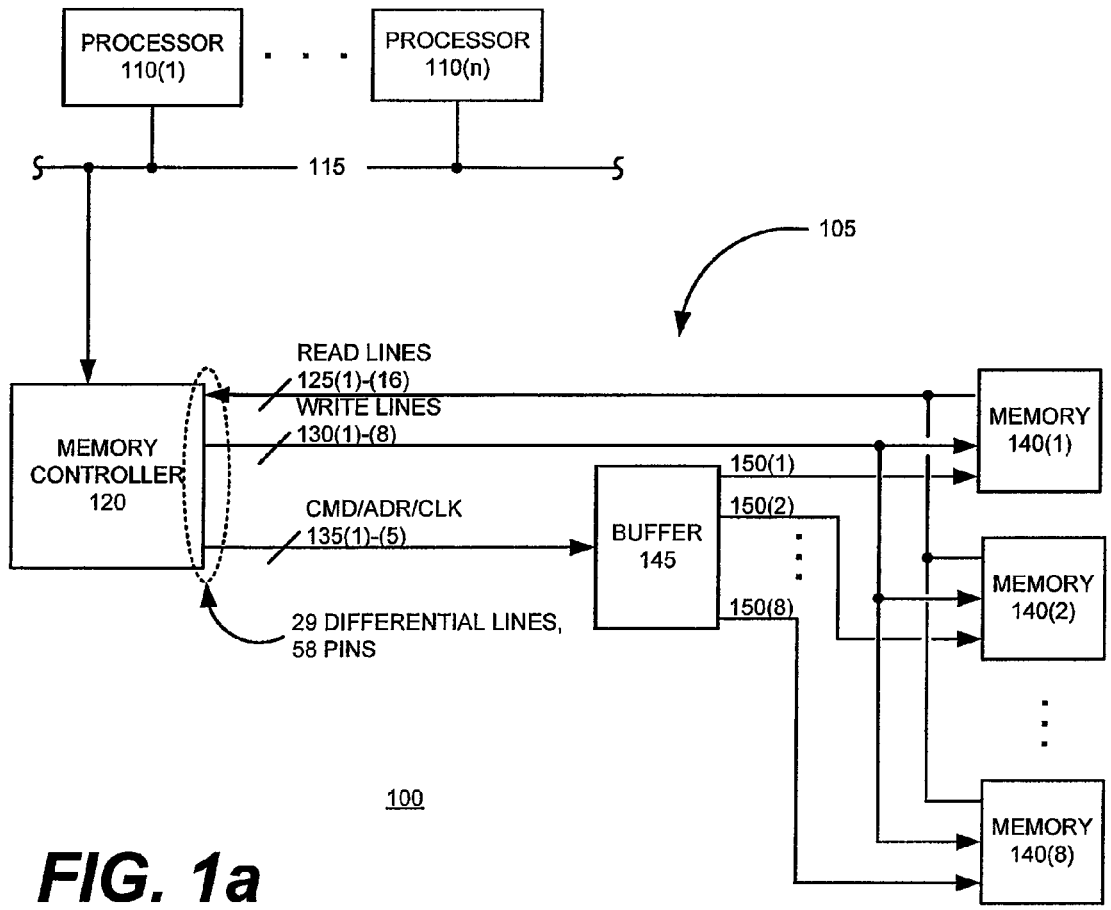
FIGS. 1a and 1b are representational block diagrams of an example information handling system with a memory topology according to an embodiment of the present invention.

Shown in FIG. 1a is a block diagram of one information handling system 100 with an exemplary memory topology 105. Referring to FIG. 1a, information handling system 100 includes one or more processors 110(1) through 110(n) (generically or collectively referred to herein as processor 110) and memory topology 105. Memory topology 105 includes a memory controller 120, a buffer 145 and a plurality of memory 140(1)-(8). Processor 110 may be coupled to memory controller 120 via a bus 115. As an alternative to the configuration illustrated in FIG. 1a, a memory controller may be provided with a processor, and, in a multi-processor system, one or more memory controllers may be provided with each processor. Memory controller 120 may provide an interface between bus 115 and peripheral connections such as a peripheral bus (not shown). Memory controller 120 is further coupled to buffer 145 via command/address and clock lines 135.

Memory controller 120 includes a plurality of ports or pins that provide input/output functionality for sending or receiving data, commands or address information. The number of pins provided with or utilized on a given memory controller may be referred to as a pin count. Memory controller 120 is coupled to memory 140(1)-(8) via read lines 125(1)-(16) and write lines 130(1)-(8). Memory 140(1)-(8), read lines 125(1)-(16) and write lines 130(1)-(8) are each collectively referred to herein as memory 140, read lines 125, and write lines 130, respectively. Individual lines of read lines 125 and write lines 130 electrically couple memory controller and a corresponding one of memory 140 via a unidirectional, differential and point-to-point connection.

The read, write, and command/address lines carry packets of information where one command packet corresponds to a read or write packet. For example, the read lines might carry 4 bits of data each for a transmission corresponding to 64 bits. The write lines might carry packets of 8 bits for a transmission corresponding to 64 bits. A single line of the command/address/clock group could be dedicated to a clock while the other 4 lines could include 8 bit packets corresponding to 32 bits of command address information.

Command/address lines 135 typically comprise a plurality of lines to transmit address information, as well as commands, such as refresh or precharge signals, to one or more units of memory 140. Buffer 145 is further coupled to memory 140 via command/address and clock lines 150(1)-(8) (collectively, command/address and clock lines 150). The use of the terms "control signal" and "control information" or in this disclosure may relate to one or more of address, command or clock information or signals. For simplicity, FIG. 1a does not separately illustrate each of read lines 125, write lines 130, command/address and clock lines 135, and memory 140; however, a plurality of each of those elements is intended.

Memory 140 may be an array of memory units that allows for sufficient bandwidth corresponding to the bandwidth of memory controller 120. Memory 140 may include, for example, an array of dynamic random access memory (DRAM) cells or static random access memory (SRAM) cells. The use of DRAM in this disclosure is exemplary. Memory topology 105 may also be adapted to accommodate future generations of memory technologies.

Figure 1B:
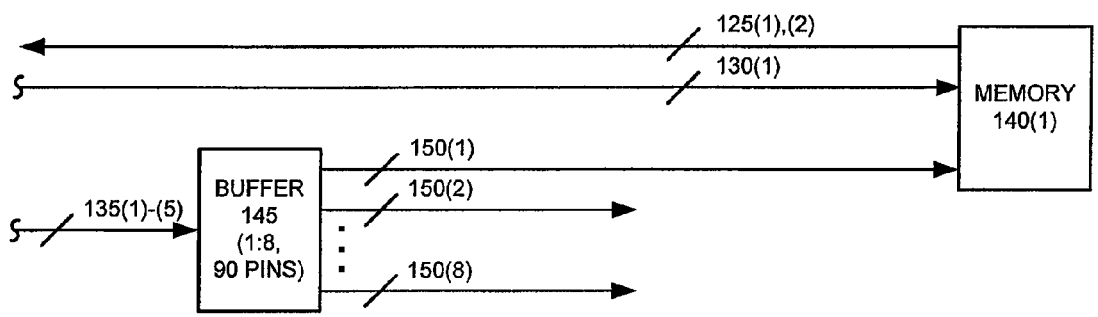

Shown in FIG. 1b is a more detailed view of buffer 145 and memory 140(1). In this embodiment, command/address and clock lines 135 and 150(1)-(8) each comprise four differential command/address lines and one clock line. Buffer 145 may buffer signals from memory controller 120 and provide isolation along the interface with the memory 140(1). Buffer 145 may be a retiming repeater that re-times or resynchronizes signals with a clock, as well as amplifying the signals as needed, before re-transmitting the signals so that variances in the communication lines may accommodated. Buffer 145 may provide fan-out functionality in memory topology 105. Buffer 145 receives command/address and clock signals from memory controller 120 and transmits a copy of the signals to one or more of memory 140 via command/address and clock lines 150, which are disposed in the topology to distribute the copies. For example, a copy of the command, address and clock signals may be distributed to memory 140(1) via command/address and clock lines 150(1). Additional copies may be distributed to the other units of memory 140(2)-(8) via corresponding sets of lines 150(2)-(8).

In a read operation according to an embodiment of the present invention, memory controller 120 transmits command, address and clock signals to buffer 145 via one or more point-to-point connections 135. Buffer 145 receives the data and transmits corresponding signals to one or memory 140 via one or more point-to-point connections 150. In response, one or more memory 140 may transmit corresponding signals to memory controller 120 via one or more point-to-point connections 125.

The command, address and clock lines 135, 150 of memory topology 105, in conjunction with the functionality of the buffer 145, provide a dedicated path that may reduce the complexity of the transmit and receive devices involved in conventional memory topologies. For example, the reduced complexity may be apparent as compared with other topologies that require multiplexing and demultiplexing (mux/demux) of data and address information at both ends of controller-to-multiple-device topologies. The present invention eliminates the need for mux/demux of data and address information as well as related scheduling complexities.

FIGS. 1a and 1b illustrate an embodiment where memory topology 105 includes a plurality of memory cells connected with a memory controller and a buffer device providing access between the memory cells and other parts of the information handling system. In general, the present invention may be employed with a variety of serial interconnect topologies that use a single device connected to multiple devices. More specifically, FIGS. 1a and 1b illustrate an embodiment where memory topology 105 employs one memory controller with eight memory cells. That ratio of 1:8 may be optimal, although other embodiments may employ different ratios of devices such as 1:4 or 1:16.

With such a topology, the pin count at the memory controller may be reduced. In the FIG. 1a example of a topology with a 1:8 ratio, summing the 16 read lines, 8 write lines, 4 clock lines and 1 clock line results in a total of 29 differential lines. To provide a typical single memory channel interface with 29 differential lines, a memory controller may only need to dedicate an approximate pin count of 58. Buffer 145 may only need to dedicate an approximate pin count of 90. The reduction of pin count may be advantageous, for example, by resulting in reduced costs and reduced complexity. Higher pin counts are typically more expensive for the physical layer interfaces where, to accommodate higher pin counts, devices such as drives, receivers or serializers are typically more expensive. Without the benefit of the present invention, a typical single memory channel interface may require a memory controller, for example, with approximately twice the pin count needed in the present invention.

Figure 2A:
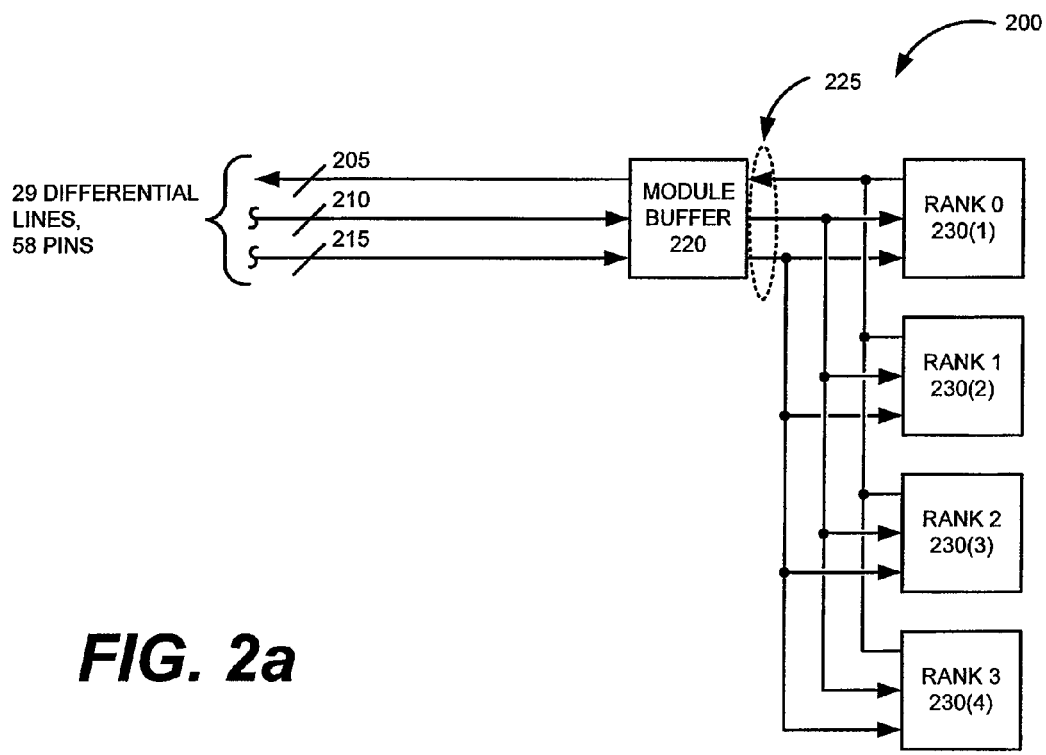
FIGS. 2a and 2b are representational block diagrams of an example memory topology illustrating module expansion according to other embodiments of the present invention.
Figure 2B:
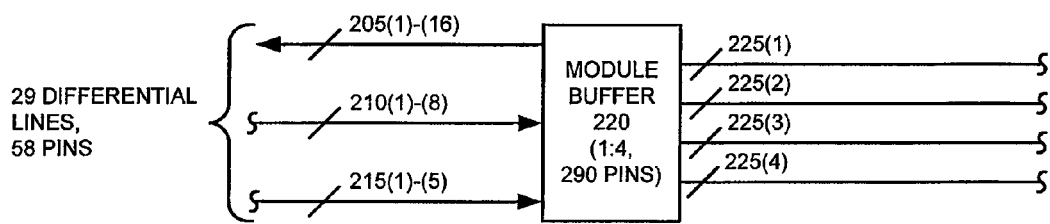

FIGS. 2a and 2b illustrate an embodiment where a memory topology may be configured to provide for increased capacity and scalability with a memory expansion module 200. Referring to FIG. 2a, 16 differential read lines 205, 8 differential write lines 210, and 5 differential command/address and clock lines 215 are coupled to module buffer 220. In some embodiments, lines 205, 210 and 215 may couple module buffer 220 to a memory controller (not shown). Module buffer 220 may buffer signals from a memory controller, provide isolation of the interface with memory units downstream, and may be a retiming repeater generally providing functionality similar to that of buffer 145 discussed above. Module buffer 220 provides additional levels of fan-out via lines 225 disposed to provide distribution to a plurality of ranks (collectively, 230). Each rank may correspond to a buffer-to-memory distribution such as that illustrated in FIGS. 1a and 1b.

Shown in FIG. 2b is a more detailed view of module buffer 220. Module buffer 220 sends read signals via lines 205, receives write signals via lines 210, and receives command/address and clock signals via lines 215. Module buffer 220 transceives copies of read, write, command, address and clock signals via gated copy lines 225, which are disposed to distribute the copies. For example, a copy of the command, address and clock signals corresponding to rank 0 (identified in FIG. 2a as 230(1)) may be transceived via gated copy line 225(1), which collectively provides a plurality of differential lines corresponding to 16 differential read lines, 8 differential write lines, and 5 differential command/address and clock lines. Additional copies may be distributed to ranks 1 through 3 (identified in FIG. 2a as 230(2)-(4)) via corresponding sets of lines 225(2)-(4).

Such a module expansion maintains a reduced pin count at the memory controller. For a configuration where each rank corresponds to a 1:8 buffer-to-memory distribution such as that illustrated in FIGS. 1a and 1b, the total number of differential lines 205, 210 and 215 may be maintained at 29. To provide the serial interface with 29 differential lines, a memory controller may still only need to dedicate an approximate pin count of 58. Module buffer 220 may need to dedicate an approximate pin count of 290 for a module-to-rank distribution ratio of 1:4. Note that a rank may consist of buffer 145 and memories 140 shown in FIG. 1B.

Figure 3A:
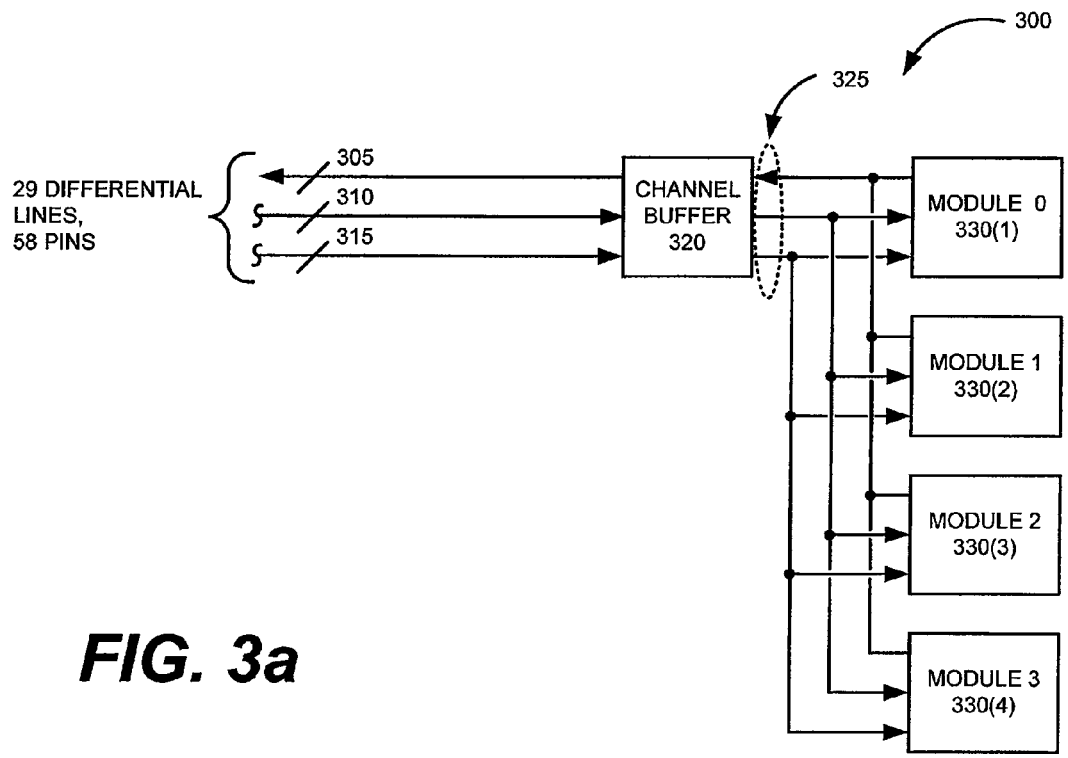
FIGS. 3a and 3b are representational block diagrams of an example memory topology illustrating channel expansion according to other embodiments of the present invention.
Figure 3B:
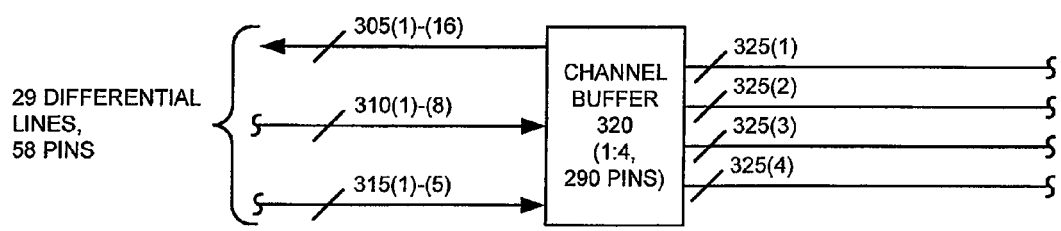

FIGS. 3a and 3b illustrate an embodiment where a memory topology may be configured to provide for increased capacity and scalability with a channel expansion module 300. Referring to FIG. 3a, 16 differential read lines 305, 8 differential write lines 310, and 5 differential command/address and clock lines 315 are coupled to channel buffer 320. Lines 305, 310 and 315 may couple channel buffer 320 to a memory controller (not shown). Channel buffer 320 may buffer signals from a memory controller, provide isolation of the interface with memory units downstream, and may be a retiming repeater generally providing functionality similar to that of buffer 145 discussed above. Channel buffer 320 provides additional levels of fan-out via lines 325 disposed to provide distribution to a plurality of modules (collectively, 330). Each module may correspond to a buffer-to-rank distribution such as that illustrated in FIGS. 2a and 2b.

Shown in FIG. 3b is a more detailed view of channel buffer 320. Channel buffer 320 sends read signals via lines 305, receives write signals via lines 310, and receives command/address and clock signals via lines 315. Channel buffer 320 transceives copies of read, write, command, address and clock signals via gated copy lines 325, which are disposed to distribute the copies to one or more modules 330. For example, a copy of the command, address and clock signals corresponding to module 0, which is identified in FIG. 3a as 330(1), may be transceived via gated copy line 325(1), which collectively provides a plurality of differential lines corresponding to 16 differential read lines, 8 differential write lines, and 5 differential command/address and clock lines. Additional copies may be distributed to modules 1 through 3 (identified in FIG. 3a as 330(2)-(4)) via corresponding sets of lines 325(2)-(4). Accordingly, the channel expansion of the present invention may be employed to create multiple copies of a channel. In the alternative or in combination, multiple channels may be accessed in parallel from a memory controller.

Figure 4:
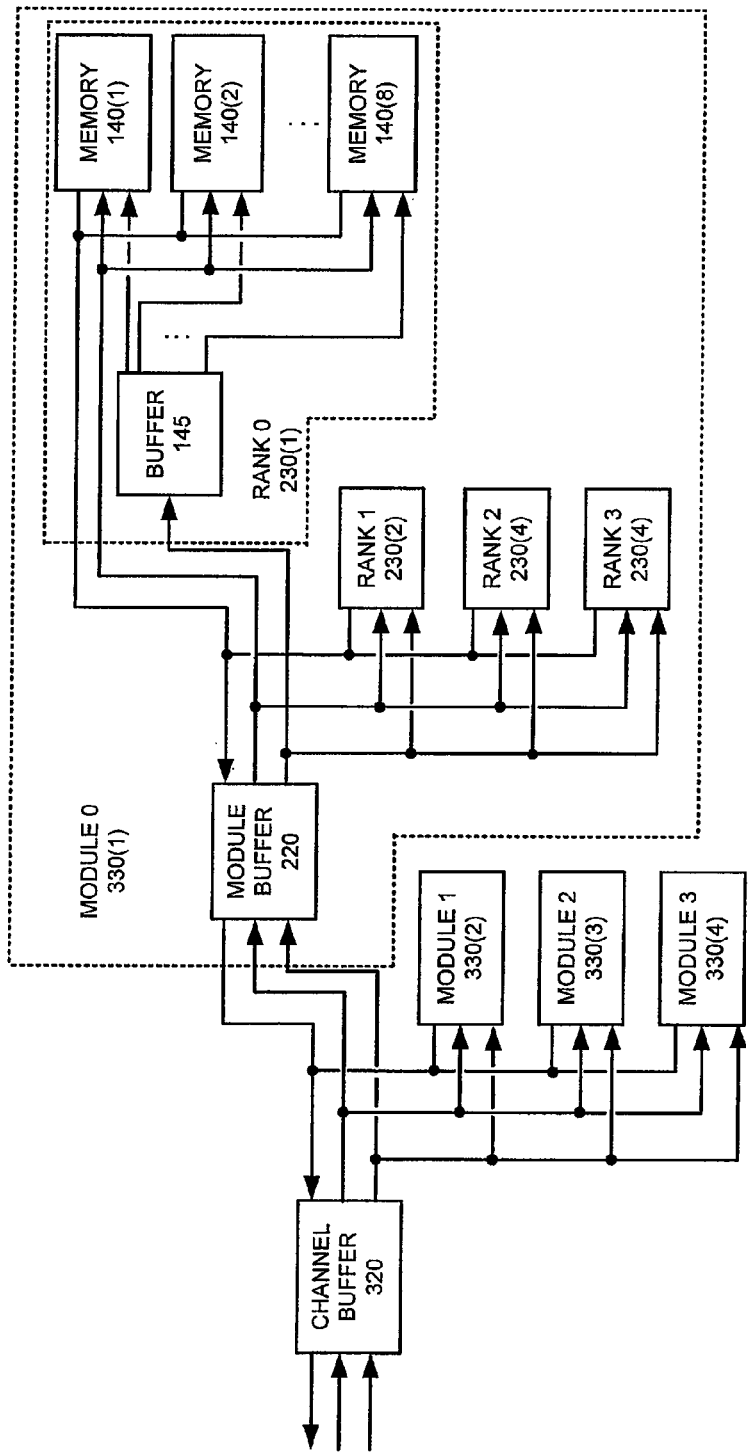
FIG. 4 is a representational block diagram of an example memory topology illustrating channel and module expansion according to other embodiments of the present invention.

FIG. 4 illustrates a memory topology with a channel expansion where channel buffer 320 is coupled to modules 330(1)-(4), where each module 330 corresponds to a 1:4 buffer-to-rank module expansion such as that illustrated in FIGS. 2a and 2b with each module buffer 220 coupled to ranks 230(1)-(4), and where each rank 230 corresponds to a 1:8 buffer-to-memory distribution such as that illustrated in FIGS. 1a and 1b with each buffer 145 coupled to memory 140(1)-(8). Such a channel expansion maintains the reduced pin count at the memory controller. For example, the total number of differential lines 305, 310 and 315 may remain 29. To provide the serial interface with 29 differential lines, a memory controller may still only need to dedicate an approximate pin count of 58. Channel buffer 320 may need to dedicate an approximate pin count of 290 for a buffer-to-module distribution ratio of 1:4.

Accordingly, FIG. 4 illustrates an upgradeable memory system having, for example, 4 memory modules and 32 memory device capacity. Such a memory system allows for a serial transfer rate equivalent to a single-ended system at 4 times the frequency. Using such a memory topology, processors, servers, information handling systems, etc. may leverage a given design to provide improved capacity. For example, one typical server may allow 4 channels per socket. With 4 modules per channel, 4 ranks per module and 8 devices per rank, that amounts to a total of 512 devices per socket.

Thus, the system and method disclosed herein provides the potential for unidirectional, differential, point-to-point interconnect topologies that optimize speed. At very high speeds, the present invention is preferable to conventional two-way data buses, for example, which are more limited at very high speeds. The present invention provides the advantages of cost effectiveness and reduced complexity of transmission and receiving devices, especially for systems operating at very high speeds. The present invention also advantageous in providing upgradeability, scalability and reduced pin count with the use of fan-out aspects of the disclosed topologies. Other technical advantages will be apparent to those of ordinary skill in the art in view of the specification, claims and drawings.

Although the present disclosure has been described in detail, it should be understood that various changes, substitutions, and alterations can be made hereto without departing from the spirit and the scope of the invention as defined by the appended claims. Various changes, substitutions, and alterations can be made to interfaces with multiple devices at one end and a single device at the other end without departing from the spirit and the scope of the invention.

What is claimed is:

1. An information handling system comprising:
one or more processors;
a memory controller coupled to the one or more processors;
a channel buffer coupled to the memory controller, wherein the channel buffer is configured to receive control information from the memory controller; and
a plurality of memory modules coupled to the channel buffer by a first plurality of point-to-point control distribution paths and by a first plurality of point-to-point data paths, wherein the channel buffer is further configured to transmit two or more copies of replicated control information to two or more of the plurality of memory modules;
wherein at least one of the plurality of memory modules comprises:
a module buffer, wherein the module buffer transceives the two or more copies of replicated control information via gated copy lines which are disposed to distribute the copies; and
a plurality of ranks, wherein the module buffer provides additional levels of fan-out via the gated copy lines disposed to provide distribution to a plurality of the plurality of ranks;
wherein at least one of the ranks comprises:
a buffer configured to receive control information from the module buffer; and
a plurality of memory devices coupled by a second plurality of point-to-point control distribution paths to the buffer and by a second plurality of point-to-point data paths directly to the module buffer, wherein the buffer is further configured to transmit two or more copies of replicated control information to two or more of the plurality of memory devices.

2. The information handling system of claim 1, wherein the first plurality of data paths and the second plurality of data paths comprise a plurality of read lines for unidirectional, differential, point-to-point read signals and a plurality of unidirectional, differential, point-to-point write lines for write signals.

3. The information handling system of claim 2, wherein each of the plurality of memory devices comprises a serial interface.

4. The information handling system of claim 3, wherein the control information comprises command, address and timing information.

* * * * *